(12) United States Patent
Erdogan

(10) Patent No.: US 7,199,673 B2
(45) Date of Patent: Apr. 3, 2007

(54) PRECHARGE CIRCUIT

(75) Inventor: Ozan Erdogan, Campbell, CA (US)

(73) Assignee: Qualcomm Incorporated, San Diego, CA (US)

( * ) Notice: Subject to any disclaimer, the term of this patent is extended or adjusted under 35 U.S.C. 154(b) by 10 days.

(21) Appl. No.: 11/083,180

(22) Filed: Mar. 17, 2005

(65) Prior Publication Data

US 2006/0208809 A1 Sep. 21, 2006

(51) Int. Cl.
*H03L 7/093* (2006.01)
(52) U.S. Cl. .............. 331/17; 331/8; 331/14; 331/25
(58) Field of Classification Search .......... 331/8, 331/14, 16–18, 25, DIG. 2
See application file for complete search history.

(56) References Cited

U.S. PATENT DOCUMENTS 5,461,344 A * 10/1995 Andoh ............... 331/1 A
6,504,437 B1 1/2003 Nelson et al. ........ 331/14

OTHER PUBLICATIONS

The TDA 5220 ASK/FSK Single Conversion Receiver-Version 1.1, Infineon Technologies AG, München, Germany, Oct. 2004, pp. 28-31.
"A Simple Precharged CMDS Phase Frequency Detector", by H. O. Johansson, IEEE Jrnl. of Solid-State Circuits, vol. 33, No. 2, Feb. 1998. pp. 295-299.

* cited by examiner

*Primary Examiner*—David Mis
(74) *Attorney, Agent, or Firm*—Saile Ackerman LLC; Stephen B. Ackerman; Billy Knowles

(57) ABSTRACT

A precharge circuit that initializes an electronic filter to a middle voltage level of an operational voltage includes a filter isolation device, a filter communication device, and an initializing device. The filter isolation device isolates the electronic filter from electronic circuits connected to an input and an output of the electronic filter to segregate the electronic filter from the electronic circuits connected to the input and the output of the electronic filter during a precharge time. The filter communication device allows communication between the precharge circuit and the electronic filter for initializing the charge state during the precharge time. The initializing device provides an initializing signal to the charge state of the electronic filter during the precharge time. The precharge circuit further has a biasing device in communication with the initializing device to provide a mid level control signal providing a reference level of the charge state.

23 Claims, 4 Drawing Sheets

*FIG. 1 — Prior Art*

PRECHARGE CIRCUIT

BACKGROUND OF THE INVENTION

1. Field of the Invention

This invention relates generally to electronic frequency synthesizer circuits. More particularly, this invention relates to phase locked loop frequency synthesizers. Even more particularly, this invention relates to loop precharge circuits for improving settling time of phase locked loop frequency synthesizers.

2. Description of Related Art

Phase locked loop frequency synthesizers, as shown in FIG. 1, have a voltage controlled oscillator 5 that generates a fundamental output signal $\omega_o$ 10. A portion of the fundamental output signal $\omega_o$ 10 is fed back as an input to the feedback divider 15. This portion of the fundamental output signal $\omega_o$ 10 is divided a factor of N or N+1 to be converted to a frequency approximately equal to the frequency of an input reference signal $\omega_{REF}$ 25. The divided fundamental output signal $\omega_o$ 10 and input reference signal $\omega_{REF}$ 25 are the inputs to an error detector 20. The error detector has a phase frequency detector 30 and a charge pump 40. The phase frequency detector 20 compares the frequency and phase of the fundamental output signal $\omega_o$ 10 and the input reference signal $\omega_{REF}$ 25 to develop the an output error signal $\epsilon_s$ 35. The output error signal $\epsilon_s$ 35 is an input to the charge pump 40. The charge pump 40 creates a charge current $i_c$ 45 that is proportional to the output error signal $\epsilon_s$ 35. The charge current $i_c$ 45 is the input control signal to the loop filter 50. The loop filter 50 filters any spurious signals that may exist in the output error signal $\epsilon_s$ 35 to generate an essentially DC voltage control signal for the voltage controlled oscillator 5. It is known in the art that the loop filter 50 may take any number of configurations including passive lead/lag networks, active integrators with either passive lead networks or passive lead/lag net works. In the example as shown, the resistor $R_1$, 55, the capacitor $C_2$ 60, and the capacitor $C_1$, 65 form a lead/lag network.

It can be shown that the size of the filter capacitor $C_2$ 60 determines the time constant for the settling of the DC voltage control signal at initialization of the voltage control oscillator 5 or a change of frequency of the voltage controlled oscillator 5. If the filter capacitor $C_2$ is large the fundamental output signal $\omega_o$ 10 is stable but has a long time constant at initialization or frequency change of the voltage controlled oscillator 5. On the other hand, if the filter capacitor $C_2$ is small, the fundamental output signal $\omega_o$ 10 is subject to minor fluctuations and is not as stable. However, the time constant at initialization is short and the voltage controlled oscillator 5 adjusts very quickly either at startup or with frequency changes.

The U3600BM programmable single-chip multichannel cordless telephone integrated circuit from Atmel Corporation, San Jose, Calif. for operation in 900 MHz wireless radio frequency applications employs phase locked loops for the modulator, demodulator, mixer, and local oscillator. The phase locked loops of the mixer and local oscillator must be tunable to select the channels of operation of the cordless telephone application. The voltage controlled oscillator 5 in such an application of the U3600BM has a coarse tuning circuit 70 which adjusts the fundamental output signal $\omega_o$ 10 to the midband of each channel of the 900 Mhz radio band. The frequency select signal $F_{SEL}$ 75 provides a command signal, generally digital, the forces the voltage controlled oscillator 5 to adjust the fundamental output signal $\omega_o$ 10 to the midband frequency.

In applications that require rapid changes to the channel setting of the voltage controlled oscillator 5, it is desirable to precharge the loop filter 50 to a middle voltage level representative of the middle range of the output error signal $\epsilon_s$ 35. The U3600BM includes a loop precharge circuit that is activated when the U3600BM is in receive mode that charges the modulator loop filter to about half of the voltage level of the charge pump 45 voltage level. This precharge insures a fast locking time of the phased locked loop.

The concept of precharging filter circuits is further described in "The TDA 5220 ASK/FSK Single Conversion Receiver—Version 1.1, Infineon Technologies AG, München, Germany, October 2004, pp,: 28–31. The TDA 5220 incorporates a precharge circuit for a loop filter of a slicer threshold. The data slicer threshold is generated with an external RC network. It is necessary to use large values for the capacitor in order to achieve long time constants. When the device is turned on the long time constant dominates the time necessary for the device to be able to demodulate data properly, since the capacitor has been discharged by leakage currents. When the slicer is activated, the loop filter is precharged by an in rush current. This current is then deactivated when the capacitor is charged to middle voltage level value.

"A Simple Precharged CMOS Phase Frequency Detector", Johansson, IEEE Journal of Solid-State Circuits, February 1998, pp.: 295–299, Volume: 33, Issue: 2, proposes a simple precharged CMOS phase frequency detector (PFD).

U.S. Pat. No. 6,504,437 (Nelson, et al.) describes a phase-lock loop (PLL) circuit provides fast locking and low spurious modulation jitter through "gearshifting" control. The gearshifting PLL combines the advantages of low jitter from integer-N PLL and fast locking from fractional-N PLL. The PLL circuit includes a phase/frequency detector, a charge pump, a loop filter, and a voltage controlled oscillator (VCO). Control of the PLL circuit includes configuring the PLL circuit in two configurations, one for each phase of operation. The bandwidth of the loop filter is increased during the first phase of operation and the circuit is locked to a frequency that is close to the desired output frequency. During the second phase, the bandwidth of the loop filter is decreased and the circuit is locked to the desired frequency. The first configuration provides a relatively fast lock time compared to the lock time provided by the second configuration. The second configuration provides more stability than the first configuration.

SUMMARY OF THE INVENTION

An object of this invention is to provide a precharge circuit for initializing a filter when power is initially applied to the filter or an operating state is modified.

Another object of this invention is to provide a precharge circuit for initializing a loop filter of a phase locked loop frequency synthesizer to a middle voltage level of an operational voltage to insure a fast locking time of the phase locked loop.

To accomplish at least one of these objects, a precharge includes a filter isolation device, a filter communication device, and an initializing device. The filter isolation device is connected to isolate the electronic filter from electronic circuits connected to an input and an output of the electronic filter to segregate the electronic filter from the electronic circuits connected to the input and the output of the electronic filter during a precharge time. The filter communication device is connected to allow communication between the precharge circuit and the electronic filter for initializing the charge state during the precharge time. The initializing device is connected to provide an initializing signal to the charge state of the electronic filter during the precharge time. The precharge circuit further has a biasing device in communication with the initializing device to provide a mid level control signal providing a reference level of the charge state.

The initializing device includes a differential pair of transistors. The differential pair of transistors has a first gate connected to receive the mid level control signal, a second gate connected to a output port to sense the charge state, and provide an output signal indicative of a difference between the mid-level signal and the charge state. The driver section is connected to receive the output signal from the differential pair of transistors and connected to drive the charge state until the charge state is equal to the mid level control signal.

The filter isolation device has a first switch connected to isolate the input of the electronic filter from the electronic circuits during the precharge time. A second switch of the filter isolation device is connected to isolate the output of the electronic switch from the electronic circuits during the precharge time.

The filter communication device includes at least one switch connected to permit the initializing device to communicate the precharging signal to the electronic filter during the precharge time. Upon termination of the precharge time the switches are set to a state to cause the initializing device to be disabled.

The electronic circuit at the output of the electronic filter is a voltage controlled oscillator wherein the filter communication device has a second switch connected such that the biasing device provides the mid-level control signal to the voltage control oscillator to set mid-band frequency of the voltage controlled oscillator.

DETAILED DESCRIPTION OF THE INVENTION

A loop precharge circuit of this invention isolates a filter from electronic circuits at its input and output during a precharge time. The loop precharge circuit then charges the filter to a charge state at a mid level of the operating range of the filter. When the filter has been precharged, the loop precharge circuit reestablishes the circuit connections of the electronic circuits and the input and output of the filter for operation and disables its own operation. The loop precharge circuit provides a higher level current necessary to set the charge state of the filter more quickly than the normal operational mode.

In a phase locked loop, the precharge circuit isolates the loop filter from the error detector circuit and the voltage controlled oscillator. The loop precharge circuit biases the input of the voltage controlled oscillator to set its operation at its mid level frequency to lessen the lock time of the oscillator. If the error detector includes a charge pump, the current of the charge pump is added with the charging current of the loop precharge circuit. Alternately, if there is not charge pump, the loop precharge circuit isolates the error detector from the loop filter for charging.

Figure 1:
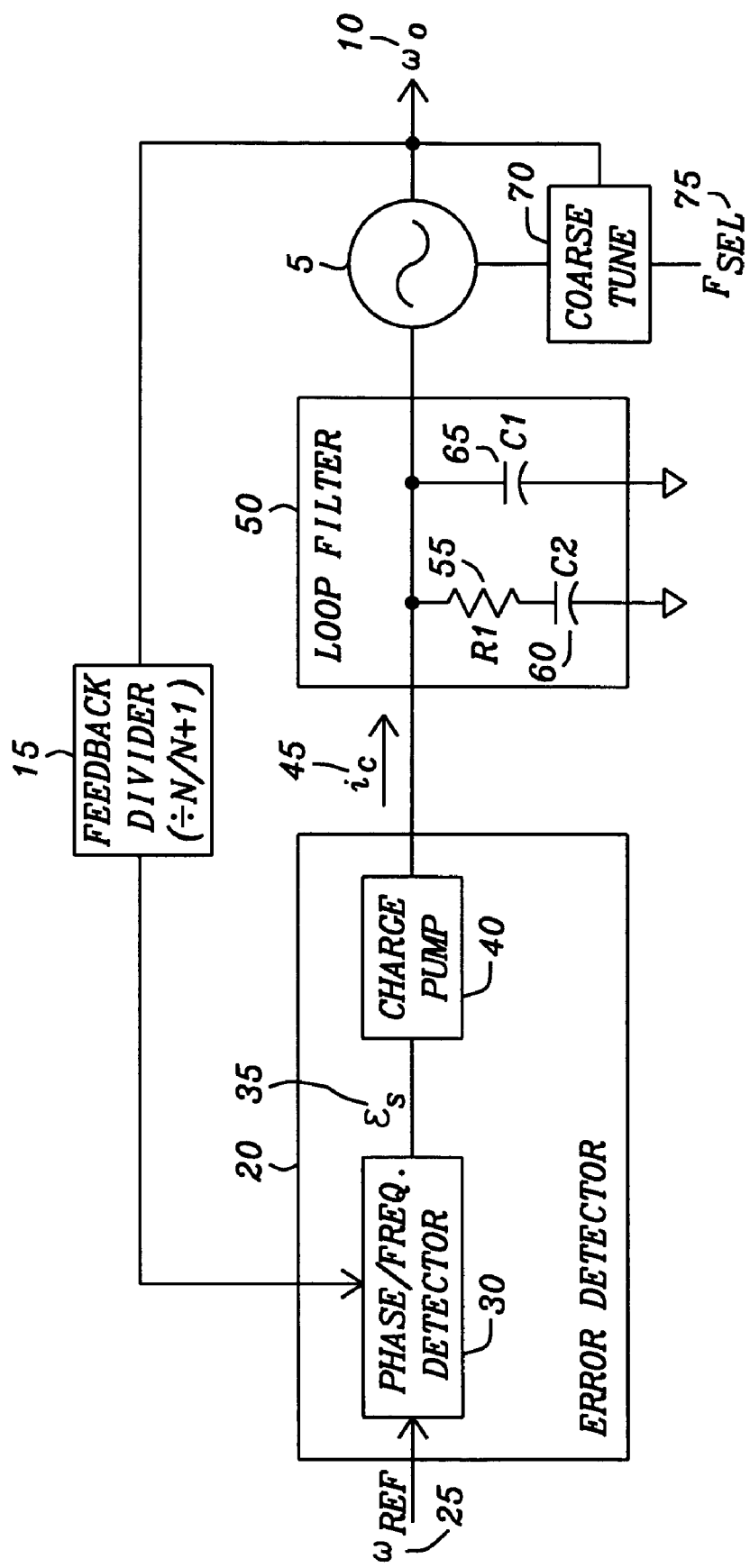
FIG. 1 is a block diagram of phase locked loop of the prior art.
Figure 2:
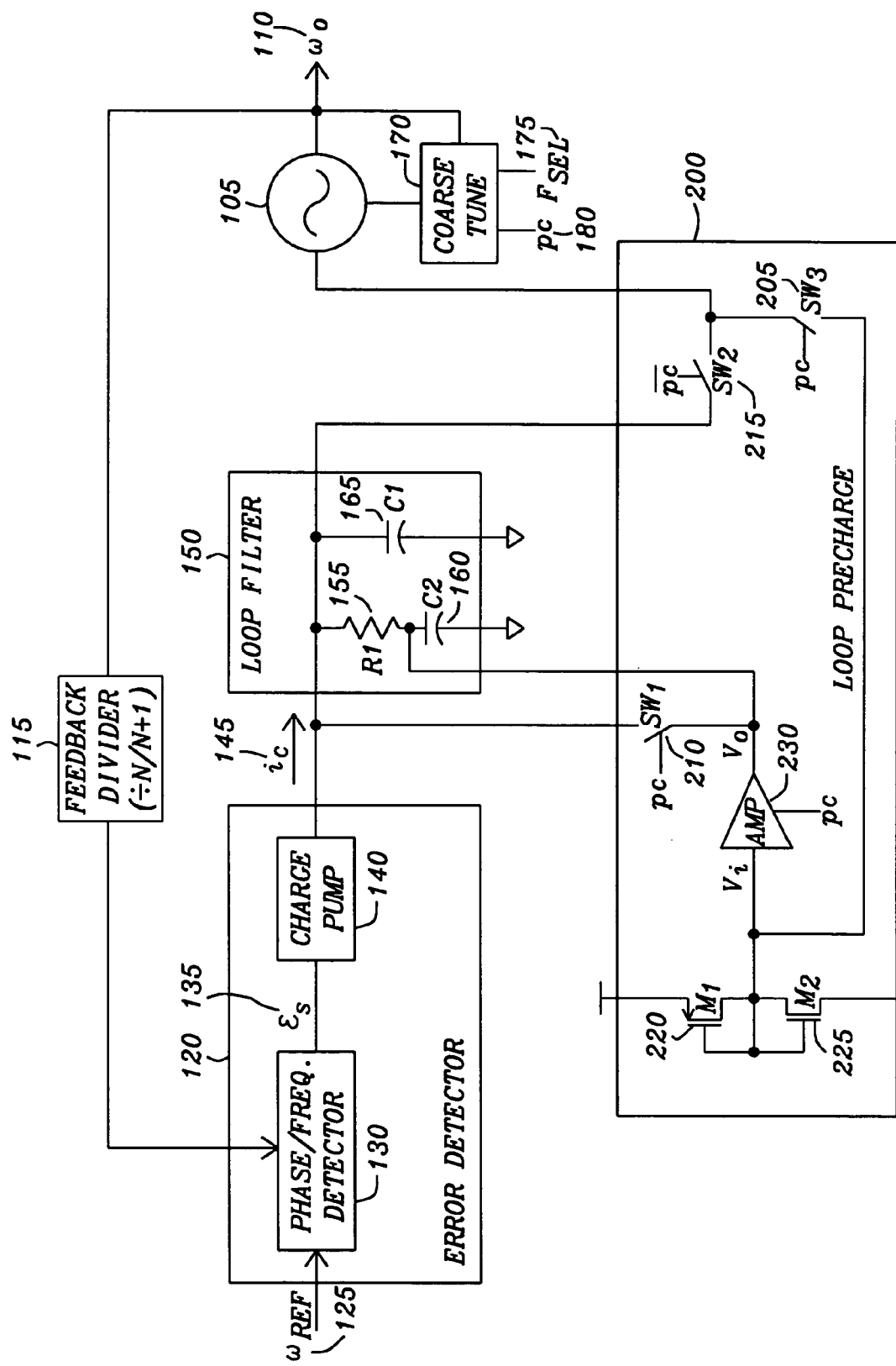
FIG. 2 is a block diagram of phase locked loop with a loop precharge circuit of this invention.

As shown in FIG. 2, the phase locked loop frequency synthesizer of this invention has a voltage controlled oscillator 105 that generates a fundamental output signal $\omega_o$ 110. A portion of the fundamental output signal $\omega_o$ 110 is fed back as an input to the feedback divider 115. This portion fundamental output signal $\omega_o$ 110 is divided a factor of N or N+1 to be converted to a frequency approximately equal to the frequency of an input reference signal $\omega_{REF}$ 125. The divided fundamental output signal $\omega_o$ 110 and input reference signal $\omega_{REF}$ 125 are the inputs to an error detector 120. The error detector 120 has a phase frequency detector 130 and a charge pump 140. The phase frequency detector 130 compares the frequency and phase of the fundamental output signal $\omega_o$ 110 and the input reference signal $\omega_{REF}$ 125 to develop the an output error signal $\epsilon_s$ 135. The output error signal $\epsilon_s$ 135 is an input to the charge pump 140. The charge pump 140 creates a charge current $i_c$ 145 that is proportional to the output error signal $\epsilon_s$ 135. The charge current $i_c$ 145 is the input control signal to the loop filter 150. The loop filter 150 filters any spurious signals that may exist in the output error signal $\epsilon_s$ 135 to generate an essentially DC voltage control signal for the voltage controlled oscillator 105. As described above, the loop filter 150 may take any number of configurations including passive lead/lag networks, active integrators with either passive lead networks or passive lead/lag net works. In the example as shown, the resistor $R_1$ 155, the capacitor $C_2$ 160, and the capacitor $C_1$ 165 form a lead/lag network.

It can be shown that the size of the filter capacitor $C_2$ 160 determines the time constant for the settling of the DC voltage control signal at initialization of the voltage control oscillator 105 or a change of frequency of the voltage controlled oscillator 105. If the filter capacitor $C_2$ 160 is large the fundamental output signal $\omega_o$ 110 is stable but has a long time constant at initialization or frequency change of the voltage controlled oscillator 105. On the other hand, if the filter capacitor $C_2$ 160 is small, the fundamental output signal $\omega_o$ 110 is subject to minor fluctuations and is not as stable. However, the time constant at initialization is short and the voltage controlled oscillator 105 adjusts very quickly either at startup or with frequency changes.

To allow for a stable operation with a large value of capacitance, but allow for a short time constant for charging the capacitance of the loop filter, the loop precharge circuit 200 is added to the phased locked loop frequency synthesizer.

The switches $SW_1$ 210 and $SW_2$ 215 act as an isolation device to segregate or separate the effects of the error detector circuit 120 from the input of the loop filter and the voltage controlled oscillator 105 from the output of the loop filter. In the case of the switch $SW_1$ 210 as controlled by the signal pc, the loop filter is effectively in parallel with the charge pump 140 and provides a charging current that is significantly larger than the error control current $i_c$ 145 to more rapidly charge the capacitor $C_2$ 160. The switch $SW_2$ 215 opens during the precharge time, as controlled by the signal $\overline{pc}$, to isolate the loop filter from the voltage controlled oscillator.

The metal oxide semiconductor (MOS) transistors $M_1$ 220 and $M_2$ 225 are connected to provide a biasing device which generates a voltage level that is approximately the middle level of the power supply voltage source and the ground reference level. This middle voltage level $V_I$ is the input to the amplifier 230. The output of the amplifier provides an initializing signal voltage $V_o$ that is communicated through the switch $SW_1$, 210 to the top plate of the capacitor $C_1$ 165 and directly to the top plate of the capacitor $C_2$ 160. These connections effectively shorts the resistor $R_1$ 155 to eliminate its effects on the charging time of the capacitors $C_2$ 160 and $C_1$ 165 such that the charge state of the capacitor capacitors $C_2$ 160 and $C_1$ 165 is more quickly realized and the phase locked loop can achieve lock more quickly.

The amplifier 230 is activated by a precharge control signal pc to communicate the initializing signal voltage $V_o$ necessary to charge the capacitors $C_2$ 160 and $C_1$ 165. Upon completion of the precharge operation, the control signal pc deactivates the amplifier 230 and it assumes a high impedance state preventing communication between the loop precharge circuit and the loop filter.

The switch $SW_3$ 205 is activated by the control signal pc to allow the mid level voltage signal $V_i$ to be communicated to the DC control signal input of the voltage control oscillator 105. The coarse tuning circuit 170 is activated by the control signal pc and the tuning for a new channel frequency $F_{SEL}$ 175 is transmitted to the coarse tuning circuit 170. The coarse tuning circuit 170 then adjusts the fundamental output signal $\omega_o$ 110 of the voltage control oscillator 105 to approximately the center frequency of the new channel. When the loop precharge circuit 200 is deactivated the output error signal $\epsilon_s$ 135 then begins the fine tuning to quickly lock the phase locked loop.

Figure 3:
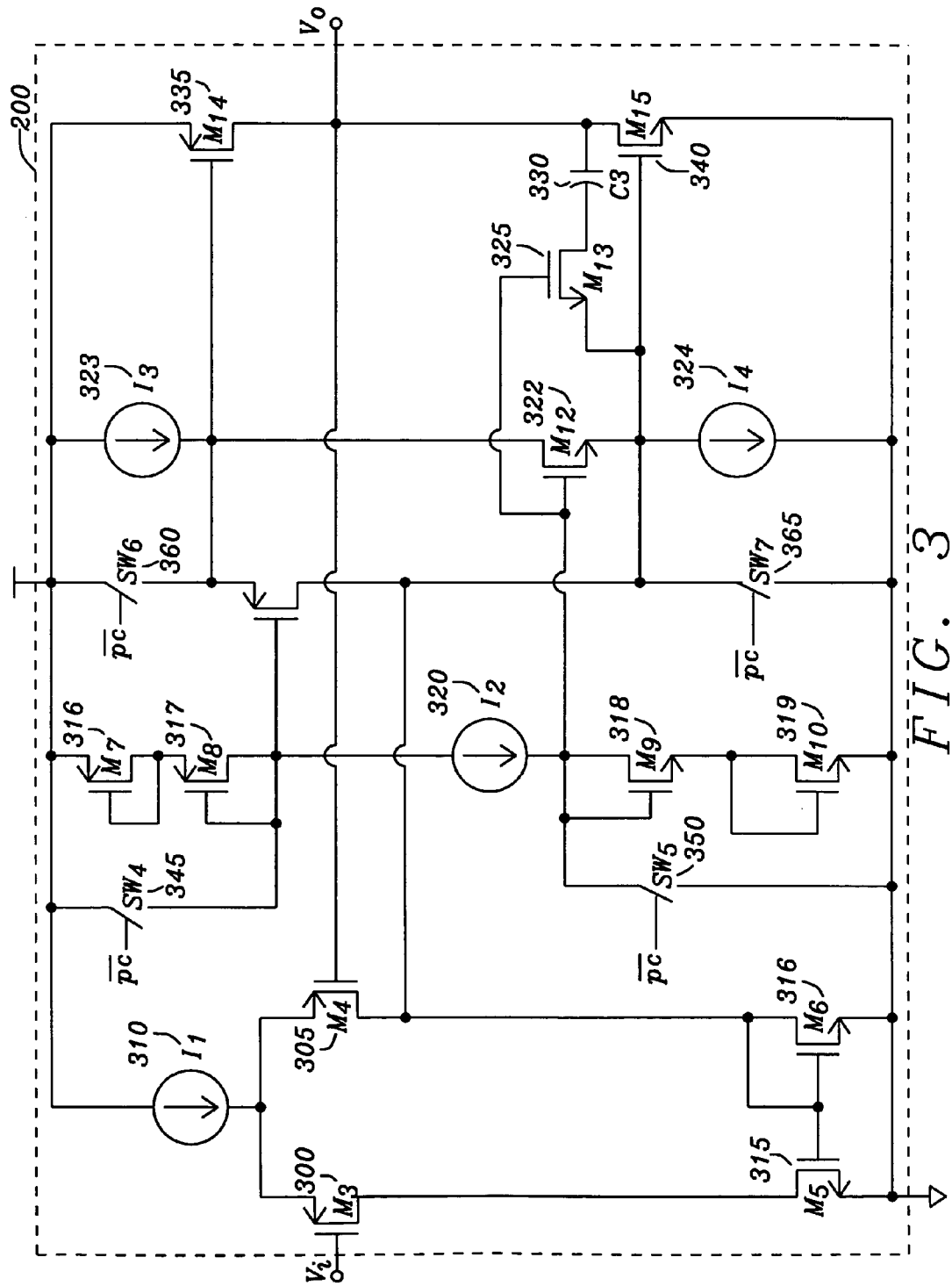
FIG. 3 is a schematic diagram of an amplifier of the loop precharge circuit of this invention as shown in FIG. 2.

Refer now to FIG. 3 for a more detailed description of the amplifier 230. The amplifier 230 is a class-AB driver similar to that described in "A Quad CMOS Single-Supply Op Amp with Rail-To-Rail Output Swing, Monticelli, IEEE Journal of Solid-State Circuits, December 1986, pp.: 1026–1034, Vol. 21, Issue: 6 and Digest of Technical Papers. 1986 IEEE International Solid-State Circuits Conference, February 1986, pp.: 18–19 Volume: XXIX.

The MOS transistors $M_3$ 300 and $M_4$ 305 form a differential pair of transistors. The gates of the differential pair of MOS transistors $M_3$ 300 and $M_4$ 305 are connected respectively to the mid level voltage signal $V_i$ and the initializing signal voltage $V_o$ to amplify any difference between the two voltages. The current source $I_1$ 310 is applied to the sources of the differential pair of MOS transistors $M_3$ 300 and $M_4$ 305 and the MOS transistors $M_5$ 315 and $M_6$ 316 are connected to the drains of the differential pair of MOS transistors $M_3$ 300 and $M_4$ 305 to act as an active load. The drain of the MOS transistor $M_4$ 305 is connected to the gate of the MOS transistor $M_{15}$ 340 and through the MOS transistor $M_{11}$, 321 to the gate of the MOS transistor $M_{14}$ 335. The MOS transistors $M_{14}$ 335 and $M_{15}$ 340 function as the driver transistors of the amplifier 230 to generate the initializing signal voltage $V_o$. The MOS transistors $M_{11}$, 321 and $M_{12}$ 322 function as level shifting devices for the inputs to the gates of the driver transistors MOS transistors $M_{14}$ 335 and $M_{15}$ 340. The MOS transistors $M_7$ 316, $M_8$ 317, $M_9$ 318, and $M_{10}$ 319 with the current sources $I_2$ 320, $I_3$ 323, $I_4$ 324 generate the necessary biasing voltages and currents for the functioning of the amplifier 230. The MOS transistor $M_{13}$ 325 implements a zero canceling resistor in series with the capacitor $C_3$ 330 during the precharge time.

During the precharge time, the switches $SW_4$ 345, $SW_5$ 350, $SW_6$ 360, $SW_7$ 365 are open and the amplifier forces the initializing signal voltage $V_o$ to be equal to the mid level voltage signal $V_i$ to charge the loop filter capacitors $C_2$ 160, and $C_1$ 165. When the precharge time has elapsed, the precharge control signal pc is deactivated and its negative control signal $\overline{pc}$ is activated causing each of the switches $SW_4$ 345, $SW_5$ 350, $SW_6$ 360, $SW_7$ 365 to close. The activation of the switches $SW_4$ 345, $SW_5$ 350, $SW_6$ 360, $SW_7$ 365 turns off the MOS transistors $M_{14}$ 335 and $M_{15}$ 340 and disables the level shifting of the MOS transistors $M_{11}$ 321 and $M_{12}$ 322 and the biasing voltages and currents from the MOS transistors $M_7$ 316, $M_8$ 317, $M_9$ 318, and $M_{10}$ 319 with the current sources $I_2$ 320, $I_3$ 323, $I_4$ 324. The MOS transistor $M_{13}$ 325 disconnects the compensation capacitor $C_3$ 330 when the precharge period is completed.

Figure 4:
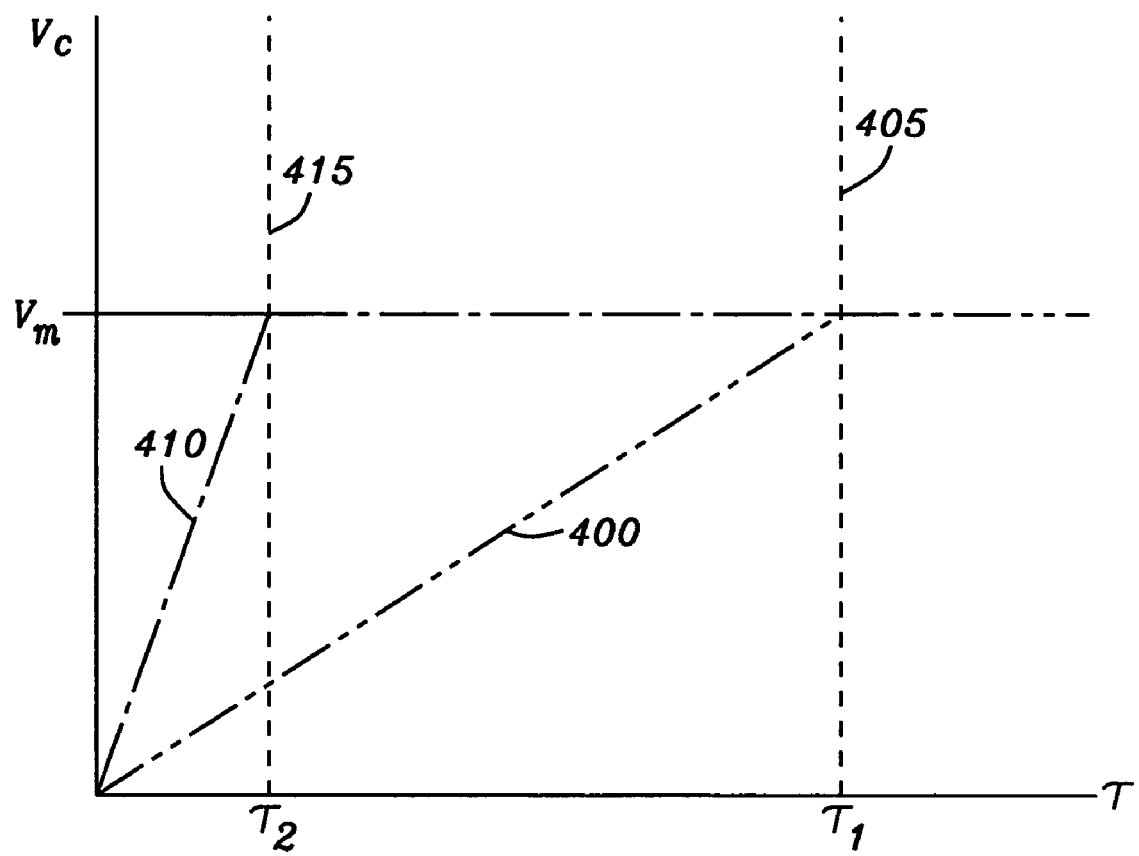
FIG. 4 is a plot of the charge time of the loop filter of a phased lock loop of the prior as compared to the charge time of the loop filter of a phased lock loop of this invention.

Refer now to FIG. 4 for an explanation of the benefits of the loop precharge circuit of this invention. If there were no precharge circuit 200 of FIG. 2, the charge pump 140 would charge the loop filter capacitors $C_2$ 160 and $C_1$ 165 according to the plot 400 until the voltage at the top plate of the capacitor $C_2$ 160 reached the mid level voltage $V_m$ at the time $\tau_1$ 405. This directly effects the locking time of the phase locked loop. However, activating the precharge circuit 230 of FIG. 2 causes the amplifier to provide the initializing signal voltage $V_o$ that causes the capacitors $C_2$ 160 and $C_1$ 165 to charge to the mid level voltage $V_M$ at the time $\tau_2$ 415. Once the DC control signal at the input of the voltage control oscillator 105 is approximately the mid level voltage $V_M$, the feedback of the fundamental output signal $\omega_o$ 110 is compared with the input reference signal $\omega_{REF}$ 125 to develop the an output error signal $\epsilon_s$ 135. The output error signal $\epsilon_s$ 135 is used to develop the control current $I_c$ 145 that applied to loop filter to develop the control voltage signal at the input of the voltage controlled oscillator 105.

In summary, the filter precharging circuit of this invention executes a method for precharging an electronic filter to an initialized charge state. The method for precharging an electronic filter begins by isolating the electronic filter from electronic circuits connected to an input and an output of the electronic filter to segregate the electronic filter from the electronic circuits connected to the input and the output of the electronic filter during a precharge time. An initializing signal is generated and communicated to the electronic filter for forcing the electronic filter to the initialized charge state during the precharge time. A mid-level control signal is provided as a reference level for the initialized charge state.

Generating the initializing signal is performed by an initializing device. The initializing device includes a differential pair of transistors having a first gate connected to receive the mid level control signal and a second gate connected to an output port to sense the charge state. An output signal is indicative of a difference between the mid-level signal and the charge state. The output signal is applied to a driver section to drive the charge state until the charge state is equal to the mid level control signal.

Isolating the electronic filter is performed by a filter isolation device. The filter isolation device is formed of a first switch connected to isolate the input of the electronic filter from the electronic circuits during the precharge time. A second switch is connected to isolate the output of the electronic switch from the electronic circuits during the precharge time.

Communicating the initializing signal is performed by a filter communication device. The filter communication device at least one switch connected to permit the initializing device to communicate the precharging signal to the electronic filter during the precharge time. Upon termination of the precharge time the switches are set to a state to cause the initializing device to be disabled.

If the electronic filter is a loop filter of a voltage controlled oscillator, the communicating the mid level control signal the filter communication device has a second switch connected such that the biasing device provides the mid level control signal to the voltage control oscillator to set midband frequency.

While this invention has been particularly shown and described with reference to the preferred embodiments thereof, it will be understood by those skilled in the art that various changes in form and details may be made without departing from the spirit and scope of the invention.

The invention claimed is:

1. A precharge circuit for initializing a charge state of an electronic filter, said precharge comprising:
    a filter isolation device connected to isolate said electronic filter from electronic circuits connected to an input and an output of said electronic filter to segregate said electronic filter from said electronic circuits connected to said input and said output of said electronic filter during a precharge time;
    a filter communication device connected to allow communication between said precharge circuit and said electronic filter for initializing said charge state during said precharge time; and
    an initializing device connected to provide an initializing signal to said charge state of said electronic filter during said precharge time to a mid level of an input voltage of said electronic filter.

2. The precharge circuit of claim 1 further comprising a biasing device in communication with said initializing device to provide a mid level control signal providing a reference level of said charge state.

3. The precharge circuit of claim 2 wherein the initializing device comprises:
    a differential pair of transistors having a first gate connected to receive said mid level control signal, a second gate connected to a output port to sense said charge state, and provide an output signal indicative of a difference between said mid-level signal and said charge state; and
    a driver section connected to receive said output signal from said differential pair of transistors and connected to drive said charge state until said charge state is equal to said mid level control signal.

4. The precharge circuit of claim 1 wherein said filter isolation device comprises:
    a first switch connected to isolate said input of said electronic filter from said electronic circuits during said precharge time; and
    a second switch connected to isolate said output of said electronic switch from said electronic circuits during said precharge time.

5. The precharge circuit of claim 1 wherein said filter communication device comprises:
    at least one switch connected to permit said initializing device to communicate said precharging signal to said electronic filter during said precharge time.

6. The precharge circuit of claim 5 wherein upon termination of said precharge time said switch are set to a state to cause said initializing device to be disabled.

7. The precharge circuit of claim 2 wherein said electronic circuit at said output of said electronic filter is a voltage controlled oscillator.

8. The precharge circuit of claim 7 wherein said filter communication device comprises a second switch connected such that said biasing device provides said mid-level control signal to said voltage control oscillator to set mid-band frequency.

9. A phase locked loop oscillator circuit comprising
    a precharge circuit for initializing a charge state of a loop filter within said phase locked loop oscillator circuit, said precharge comprising:
    a filter isolation device connected to isolate said loop filter from a phase/frequency detector incorporated in said phased locked loop oscillator circuit and connected an input of said loop filter and a voltage controlled oscillator incorporated in said phased locked loop oscillator circuit connected to an output of said loop filter to segregate said loop filter from said phase frequency detector and said voltage controlled oscillator connected to said input and said output of said loop filter during a precharge time;
    a filter communication device connected to allow communication between said precharge circuit and said loop filter for initializing said charge state during said precharge time; and
    an initializing device connected to provide an initializing signal to said charge state of said loop filter during said precharge time to a mid level of an output voltage of said voltage controlled oscillator.

10. The phase locked loop oscillator circuit of claim 9 wherein the precharge circuit further comprises a biasing device in communication with said initializing device to provide a mid-control level signal providing a reference level of said charge state.

11. The phase locked loop oscillator circuit of claim 10 wherein the initializing device comprises:
    a differential pair of transistors having a first gate connected to receive said mid level control signal, a second gate connected to a output port to sense said charge state, and provide an output signal indicative of a difference between said mid-level signal and said charge state; and
    a driver section connected to receive said output signal from said differential pair of transistors and connected to drive said charge state until said charge state is equal to said mid level control signal.

12. The phase locked loop oscillator circuit of claim 9 wherein said filter isolation device comprises:
    a first switch connected to isolate said input of said loop filter from said phase/frequency detector during said precharge time; and
    a second switch connected to isolate said output of said electronic switch from said voltage controlled oscillator during said precharge time.

13. The phase locked loop oscillator circuit of claim 9 wherein said filter communication device comprises:
    at least one switch connected to permit said initializing device to communicate said precharging signal to said loop filter during said precharge time.

14. The phase locked loop oscillator circuit of claim 13 wherein upon termination of said precharge time said switch are set to a state to cause said initializing device to be disabled.

15. The phase locked loop oscillator circuit of claim 9 wherein said filter communication device comprises a second switch connected such that said biasing device provides said mid-level control signal to said voltage control oscillator to set mid-band frequency.

16. A method for precharging an electronic filter to an initialized charge state, said method for precharging an electronic filter comprising the steps of:
    isolating said electronic filter from electronic circuits connected to an input and an output of said electronic filter to segregate said electronic filter from said electronic circuits connected to said input and said output of said electronic filter during a precharge time; and generating an initializing signal; and communicating said initializing signal to said electronic filter for forcing said electronic filter to said initialized charge state during said precharge time to a mid level of an input voltage of said electronic filter.

17. The method for precharging an electronic filter of claim 16 further comprising the step of providing a mid-level control signal as a reference level for said initialized charge state.

18. The method for precharging an electronic filter of claim 17 wherein generating said initializing signal is performed by an initializing device, said initializing device comprising:

a differential pair of transistors having a first gate connected to receive said mid level control signal, a second gate connected to a output port to sense said charge state, and provide an output signal indicative of a difference between said mid-level signal and said charge state; and a driver section connected to receive said output signal from said differential pair of transistors and connected to drive said charge state until said charge state is equal to said mid level control signal.

19. The method for precharging an electronic filter of claim 16 wherein said isolating said electronic filter is performed by a filter isolation device, said filter isolation device comprising:

a first switch connected to isolate said input of said electronic filter from said electronic circuits during said precharge time; and a second switch connected to isolate said output of said electronic switch from said electronic circuits during said precharge time.

20. The method for precharging an electronic filter of claim 17 wherein said communicating said initializing signal is performed by a filter communication device, said filter communication device comprises:

at least one switch connected to permit said initializing device to communicate said precharging signal to said electronic filter during said precharge time.

21. The method for precharging an electronic filter of claim 20 wherein upon termination of said precharge time said switch are set to a state to cause said initializing device to be disabled.

22. The method for precharging an electronic filter of claim 20 wherein said electronic circuit at said output of said electronic filter is a voltage controlled oscillator.

23. The method for precharging an electronic filter of claim 22 wherein said filter communication device comprises a second switch connected such that said biasing device provides said mid level control signal to said voltage control oscillator to set mid-band frequency.

* * * * *